US011374191B2

(12) United States Patent
Li et al.

(10) Patent No.: US 11,374,191 B2
(45) Date of Patent: Jun. 28, 2022

(54) ORGANIC LIGHT EMITTING DIODE, DISPLAY PANEL AND DISPLAY DEVICE

(71) Applicant: Yungu (Gu'an) Technology Co., Ltd., Langfang (CN)

(72) Inventors: Weiwei Li, Langfang (CN); Lin He, Langfang (CN); Mengzhen Li, Langfang (CN); Jingwen Tian, Langfang (CN); Tiantian Li, Langfang (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 221 days.

(21) Appl. No.: 16/881,051

(22) Filed: May 22, 2020

(65) Prior Publication Data

US 2020/0287154 A1    Sep. 10, 2020

Related U.S. Application Data

(63) Continuation of application No. PCT/CN2019/074153, filed on Jan. 31, 2019.

(30) Foreign Application Priority Data

Sep. 30, 2018 (CN) .......................... 201811162436.5

(51) Int. Cl.
*H01L 27/32* (2006.01)
*H01L 51/50* (2006.01)

(52) U.S. Cl.
CPC ...... *H01L 51/5096* (2013.01); *H01L 27/3218* (2013.01); *H01L 51/5056* (2013.01); *H01L 51/5072* (2013.01); *H01L 51/5092* (2013.01)

(58) Field of Classification Search
CPC .................. H01L 51/5096; H01L 51/5056
See application file for complete search history.

(56) References Cited

U.S. PATENT DOCUMENTS

2011/0233595 A1    9/2011  Akimoto
2012/0112173 A1*  5/2012  Matsumoto ......... H01L 27/3211
                                                    257/E51.026
(Continued)

FOREIGN PATENT DOCUMENTS

CN    103311448 A    9/2013
CN    103682108 A    3/2014
(Continued)

OTHER PUBLICATIONS

Pflumm, Christof TW201129245A Organic Electroluminescent Device Google Patents Translation 2011.*
(Continued)

*Primary Examiner* — Omar F Mojaddedi
(74) *Attorney, Agent, or Firm* — Ladas & Parry LLP

(57) ABSTRACT

Provided are an OLED, display panel and display device. The OLED includes a first electrode, a second electrode, a light emitting layer and at least one blocking layer. The second electrode is arranged opposite to the first electrode. The light emitting layer is arranged between the first electrode and the second electrode. The blocking layer is arranged between the light emitting layer and the second electrode and/or between the light emitting layer and the first electrode. Each blocking layer of the at least one blocking layer comprises at least two blocking materials, electron mobility of at least one blocking material of the at least two blocking materials is lower than a first preset value, electron mobility of at least another blocking material of the at least two blocking materials is higher than a second preset value, and the first preset value is lower than the second preset value.

17 Claims, 6 Drawing Sheets

(56) References Cited

U.S. PATENT DOCUMENTS

| | | | |
|---|---|---|---|
| 2014/0191206 A1 | 7/2014 | Cho | |
| 2017/0104172 A1 | 4/2017 | Forrest et al. | |
| 2017/0194591 A1* | 7/2017 | Wang | H01L 51/5004 |
| 2018/0114938 A1* | 4/2018 | Yasukawa | H01L 51/5016 |
| 2019/0280056 A1* | 9/2019 | Yasukawa | H01L 27/3211 |

FOREIGN PATENT DOCUMENTS

| | | | |
|---|---|---|---|
| CN | 103824956 A | 5/2014 | |
| CN | 103904178 A | 7/2014 | |
| CN | 104538554 A | 4/2015 | |
| CN | 104934542 A | 9/2015 | |
| CN | 106531769 A | 3/2017 | |
| CN | 107146853 A | 9/2017 | |
| TW | 201129245 A | 8/2011 | |

OTHER PUBLICATIONS

ISR_for_International_Application_PCTCN2019074153.
First Chinese Office Action dated Jun. 27, 2019 by the State Intellectual Property Office of People's Republic of China for the corresponding Chinese Patent Application No. No. 201811162436.5 and an English Translation thereof.
Second Chinese Office Action dated Mar. 3, 2020 by the State Intellectual Property Office of People's Republic of China for the corresponding Chinese Patent Application No. 201811162436.5 and an English Translation thereof.
Taiwanese Office Action and an English Translation thereof for application 201811162436.5.
Notice of Rejection of corresponding TW case and the Reply to the Notice of Rejection of corresponding TW case originals and an English Translation.
CN 106531769 A _ English Abstract.
CN 107146853 A _ English Abstract.
CN 103904178 A _ English Abstract.
TW 201129245 A _ English Abstract.
Third Chinese Office Action dated Sep. 2, 2020 by the State Intellectual Property Office of People's Republic of China for the corresponding Chinese Patent Application No. No. 201811162436.5 and an English Translation thereof.
CN 103311448 A English Translation.
CN 103682108 A _English Translation.
CN 103824956 A _English Translation.
CN 104538554 A _English Translation.
CN 104934542 A _English Translation.

* cited by examiner

ORGANIC LIGHT EMITTING DIODE, DISPLAY PANEL AND DISPLAY DEVICE

CROSS-REFERENCE TO RELATED APPLICATIONS

This is a Continuation Application of International Patent Application No. PCT/CN2019/074153, filed on Jan. 31, 2019, which claims priority to Chinese patent application No. 201811162436.5 filed on Sep. 30, 2018, contents of both of which are incorporated herein by reference in their entireties.

TECHNICAL FIELD

The present disclosure relates to the field of display technology, for example, to an Organic Light Emitting Diode, display panel and display device.

BACKGROUND

An Organic Light Emitting diode (OLED) emits light through a self-emissive lighting mechanism and thus does not require any backlight source. When the OLED is applied to a display panel and a display device, the overall thickness of the display panel and the display device is relatively thin, which is advantageous to implement the design of lightness and thinness of the display panel and the display device. Meanwhile, the OLED has the advantages including high display brightness, wide viewing angle and high response speed.

With the development of OLED materials, a material of a light emitting layer with excellent performance in the OLED is a material trending to electron transport. However, when the material trending to the electron transport is employed as the material of the light emitting layer, the lifetime of the OLED is relatively short.

SUMMARY

The present disclosure provides an OLED, display panel and display device, to improve the lifetime of the OLED.

The present disclosure provides the OLED. The OLED includes a first electrode, a second electrode, a light emitting layer and at least one blocking layer.

The second electrode is arranged oppositely to the first electrode.

The light emitting layer is arranged between the first electrode and the second electrode.

The at least one blocking layer is arranged in at least one of following manners: between the light emitting layer and the second electrode, or between the light emitting layer and the first electrode.

Each blocking layer of the at least one blocking layer includes at least two blocking materials. Electron mobility of at least one blocking material of the at least two blocking materials is lower than a first preset value, and electron mobility of at least another blocking material of the at least two blocking materials is higher than a second preset value. The first preset value is lower than the second preset value.

Furthermore, the each blocking layer includes a first blocking material and a second blocking material. Electron mobility of the first blocking material is lower than electron mobility of the second blocking material.

In the each blocking layer, a sum of a volume of the first blocking material and a volume of the second blocking material is represented as S, the volume of the first blocking material is represented as X, and $10\% \leq X/S \leq 70\%$.

Furthermore, in the each blocking layer, the volume of the first blocking material and the volume of the second blocking material satisfy a following relation: $20\% \leq X/S \leq 50\%$.

Furthermore, the at least one blocking layer includes a hole blocking layer. The hole blocking layer is arranged between the light emitting layer and the second electrode.

The hole blocking layer includes a first hole blocking material and a second hole blocking material. Electron mobility of the first hole blocking material is lower than electron mobility of the second hole blocking material.

In the hole blocking layer, a sum of a volume of the first hole blocking material and a volume of the second hole blocking material is represented as S1, the volume of the first hole blocking material is represented as X1, and $10\% \leq X1/S1 \leq 60\%$.

Furthermore, in the hole blocking layer, the volume of the first hole blocking material and the volume of the second hole blocking material satisfy a following relation: $20\% \leq X1/S1 \leq 50\%$.

Furthermore, a volume ratio of the first hole blocking material to the second hole blocking material is 1:1.

Furthermore, the electron mobility of the first hole blocking material is represented as B1, and $1.0 \times 10^{-6} \text{ cm}^2/(\text{V} \cdot \text{s}) \leq B1 \leq 1.0 \times 10^{-5} \text{ cm}^2/(\text{V} \cdot \text{s})$. The electron mobility of the second hole blocking material is represented as C1, and $1.0 \times 10^{-5} \text{ cm}^2/(\text{V} \cdot \text{s}) \leq C1 \leq 1.0 \times 10^{-4} \text{ cm}^2/(\text{V} \cdot \text{s})$.

Furthermore, the at least one blocking layer includes an electron blocking layer. The electron blocking layer is arranged between the light emitting layer and the first electrode.

The electron blocking layer includes a first electron blocking material and a second electron blocking material. Electron mobility of the first electron blocking material is lower than electron mobility of the second electron blocking material.

In the electron blocking layer, a sum of a volume of the first electron blocking material and a volume of the second electron blocking material is represented as S2, a volume of the first electron blocking material is represented as X2, and $20\% \leq X2/S2 \leq 70\%$.

Furthermore, in the electron blocking layer, the volume of the first electron blocking material and the volume of the second electron blocking material satisfy a following relation: $30\% \leq X2/S2 \leq 60\%$.

Furthermore, a volume ratio of the first electron blocking material to the second electron blocking material is 1:1.

Furthermore, the electron mobility of the first electron blocking material is represented as B2, and $1.0 \times 10^{-7} \text{ cm}^2/(\text{V} \cdot \text{s}) \leq B2 \leq 1.0 \times 10^{-5} \text{ cm}^2/(\text{V} \cdot \text{s})$. The electron mobility of the second electron blocking material is represented as C2, and $1.0 \times 10^{-5} \text{ cm}^2/(\text{V} \cdot \text{s}) \leq C2 \leq 1.0 \times 10^{-4} \text{ cm}^2/(\text{V} \cdot \text{s})$.

Furthermore, the OLED further includes a first carrier function layer and a second carrier function layer.

The first carrier function layer is arranged between the light emitting layer and the first electrode, and when the at least one blocking layer is arranged between the light emitting layer and the first electrode, the first carrier function layer is arranged between the at least one blocking layer and the first electrode.

The second carrier function layer is arranged between the light emitting layer and the second electrode, and when the at least one blocking layer is arranged between the light emitting layer and the second electrode, the second carrier function layer is arranged between the at least one blocking layer and the second electrode.

Furthermore, the first carrier function layer includes a hole injection layer and a hole transport layer stacked along a direction from the first electrode towards the light emitting layer. The second carrier function layer includes an electron injection layer and an electron transport layer stacked along a direction from the second electrode towards the light emitting layer.

The present disclosure further provides a display panel. The display panel includes a substrate and a plurality of pixel units arranged in an array on a side of the substrate.

At least a part of the pixel units includes any one of the above OLEDs provided by the present disclosure.

The present disclosure further provides a display device. The display device includes any one of the above display panels provided by the present disclosure.

DETAILED DESCRIPTION

In the related arts, a material of a light emitting layer with excellent performance in an OLED is a material trending to electron transport. The OLED further includes a first electrode (for example, the first electrode may be an anode) and a second electrode (for example, the second electrode is a cathode) respectively arranged at opposite sides of the light emitting layer. When a driving current is provided for the OLED, electrons are injected into the light emitting layer from the second electrode, and holes are injected into the light emitting layer from the first electrode. Since the material of the light emitting layer is the material trending to the electron transport, the material of the light emitting layer is advantageous to the transport of multiple electrons. Thus, a larger number of electrons reach the light emitting layer, which is advantageous to improve recombination efficiency of electrons and holes, and improve current efficiency of the OLED. However, when the number of electrons in the light emitting layer is greater than the number of holes in the light emitting layer, excess electrons cannot be recombined, and the excess electrons that cannot be recombined continue to be transported to a side close to the first electrode. This may affect performance of film layers between the light emitting layer and the first electrode, and destruct an interface between two adjacent film layers of the film layers between the light emitting layer and the first electrode, resulting in degradation of the performance of the film layers between the light emitting layer and the first electrode in the OLED, and resulting in destruction of the interface between the two adjacent film layers of the film layers between the light emitting layer and the first electrode. Therefore, the lifetime of the OLED is reduced.

The present disclosure provides an OLED to improve the lifetime of the OLED.

Figure 1:
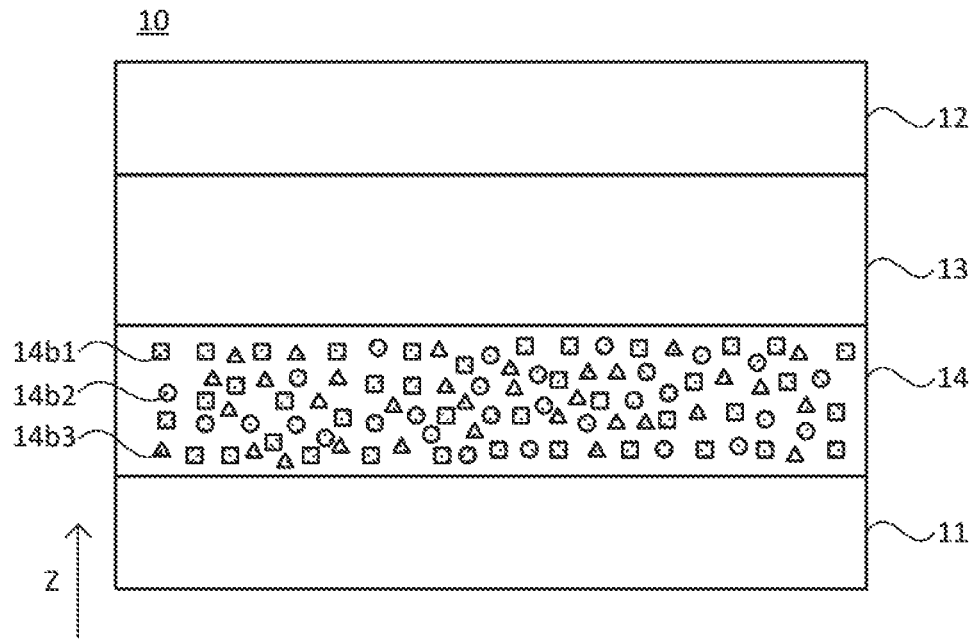
FIG. 1 is a structural diagram of an OLED provided by an embodiment of the present disclosure, in which the blocking layer 14 includes three blocking materials: a first blocking material 14b1, a second blocking material 14b2, and a third blocking material 14b3.
Figure 2:
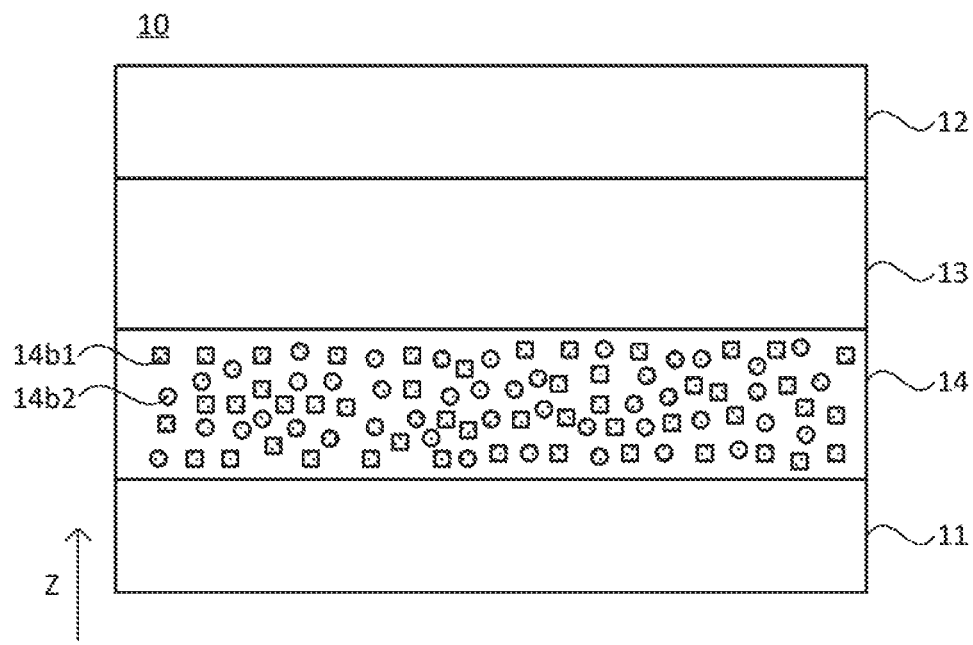
FIG. 2 is a structural diagram of another OLED provided by an embodiment of the present disclosure, in which the blocking layer 14 includes two blocking materials: the first blocking material 14b1 and the second blocking material 14b2.
Figure 3:
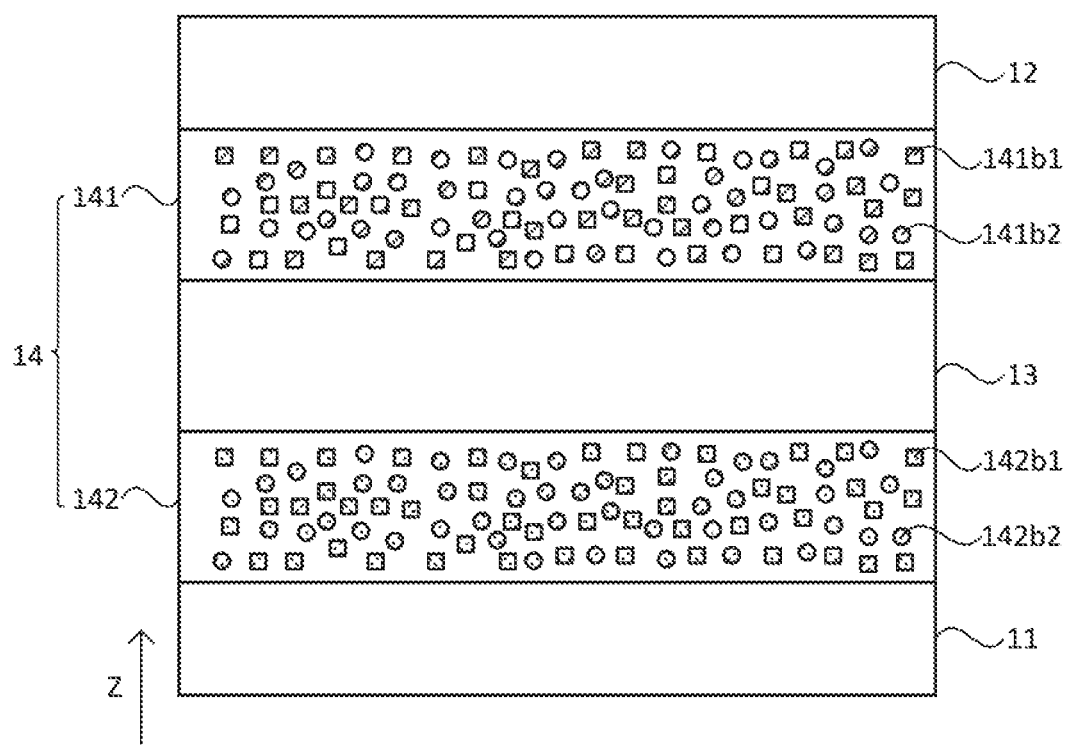
FIG. 3 is a structural diagram of another OLED provided by an embodiment of the present disclosure, in which the OLED 10 including two blocking layers 14, which are respectively shown as a first blocking layer 141 and a second blocking layer 142.

FIG. 1 is a structural diagram of the OLED provided by an embodiment of the present disclosure. FIG. 2 is a structural diagram of another OLED provided by an embodiment of the present application. FIG. 3 is a structural diagram of another OLED provided by an embodiment of the present disclosure. Referring to FIG. 1 to FIG. 3, the OLED 10 includes a first electrode 11, a second electrode 12, a light emitting layer 13 and at least one blocking layer 14 (FIG. 1 and FIG. 2 show one blocking layer 14, FIG. 3 shows two blocking layers 14, and in order to distinguish the two blocking layers 14 in FIG. 3, the two blocking layers includes a first blocking layer 141 and a second blocking layer 142). The second electrode 12 is arranged opposite to the first electrode 11. The light emitting layer 13 is arranged between the first electrode 11 and the second electrode 12. The blocking layer 14 is arranged in at least one of following manners: between the light emitting layer 13 and the second electrode 12, or between the light emitting layer 13 and the first electrode 11. Each blocking layer 14 includes at least two blocking materials, electron mobility of at least one blocking material of the at least two blocking materials is lower than a first preset value, and electron mobility of at least another blocking material of the at least two blocking materials is higher than a second preset value. The first preset value is lower than the second preset value.

The first electrode 11 may be an anode. For example, a material of the anode may be Indium Tin Oxide (ITO). The second electrode 12 may be a cathode. For example, a material of the cathode may be a metal material such as a conductive material with a lower work function, e.g., aluminum (Al), gold (Au), silver (Ag), or a metal alloy including Ag.

The light emitting layer 13 may include a light emitting host material and a light emitting guest material, and the light emitting guest material determines a light emitting color of the OLED 10.

For example, the light emitting guest material may be 2-tert-butyl-4-(dicyanomethylene)-6-[2-(1,1,7,7-tetramethyljulolidin-9-yl)vinyl]-4H-pyran (DCJTB), which corresponds to the light emitting color of the OLED 10 being red. Alternatively, the light emitting guest material may be N,N'-Dimethylquinacridone (DMQA), which corresponds to the light emitting color of the OLED 10 being green. Alternatively, the light emitting guest material may be 4,4'-bis(9-ethyl-3-carbazolylvinyl)-1,1'-biphenyl (BCzVBi), which corresponds to the light emitting color of the OLED 10 being blue.

The material of the first electrode 11, the material of the second electrode 12, and the light emitting guest material in the embodiment are only exemplary illustrations, and are not intended to limit the materials that may be employed for the first electrode 11, the second electrode 12, and the light emitting guest material in the OLED 10 provided by the embodiment of the present disclosure. In other implementations, the material of the first electrode 11, the material of the second electrode 12 and the light emitting guest material may be set according to actual requirements of the OLED 10, which is not limited in the embodiment of the present disclosure.

The light emitting principle of the OLED 10 mainly includes four processes: carrier injection, carrier transport, carrier recombination, and exciton de-excitation and light emitting.

In the process of carrier injection, when a certain voltage is applied between the first electrode 11 (taking the anode as an example) and the second electrode 12 (taking the cathode as an example) of the OLED 10, electrons of the cathode are injected into a Lowest Unoccupied Molecular Orbital (LUMO) energy level of the light emitting layer 13, and holes of the anode are injected into a Highest Occupied Molecular Orbital (HOMO) energy level of the light emitting layer 13. In the process of carrier transport, the injected electrons and holes are transported under an action of an electric field. In the process of carrier recombination, the electrons and the holes recombine in the light emitting layer 13 through the Coulomb force, to generate excitons. In the process of exciton de-excitation and light emitting, energy is released when the excitons return to a ground state, and a part of the released energy is absorbed by the light emitting guest material in the light emitting layer 13. The light emitting guest material changes from a stable ground state to an unstable excited state; and when the light emitting guest material returns from the excited state to the ground state, the light emitting guest material emits light.

The blocking layer 14 is used for improving efficiency of the transport and injection of carriers (electrons or holes) into the light emitting layer 13, and blocking the carriers (the holes or the electrons) from moving to the other side of the light emitting layer 13. Electron mobility of the at least two blocking materials employed for the at least one blocking layer 14 determines transport efficiency of the carriers, and determines light emitting efficiency and the lifetime of the OLED 10. When the electron mobility of the at least two blocking materials is higher than the second preset value, the transport efficiency of the carriers is higher. This may be understood that the number of the carriers transported to the light emitting layer 13 in a certain duration is greater, so that the light emitting efficiency of the OLED 10 is higher. At the same time, the number of the carriers transported in the OLED 10 is greater, a destruction effect of carriers not recombined on film layers and an interface between two adjacent film layers of the film layers is larger, and the lifetime of the OLED 10 is shorter. When the electron mobility of the at least two blocking materials is lower than the first preset value, the transport efficiency of the carriers is lower, that is, the number of carriers that may be transported to the light emitting layer 13 within the certain duration is less. Therefore, the light emitting efficiency of the OLED 10 is lower. At this time, since the number of carriers transported in the OLED 10 is less, the destruction effect of the multiple electrons on the film layers and the interface between the two adjacent film layers of the film layers is also less, and the lifetime of the OLED 10 is longer.

In addition, the blocking layer 14 may be evaporated through a co-evaporation form or a pre-mixed form. In the co-evaporation form, the compositions of the at least one blocking layer 14 are evaporated in respective crucibles. In the pre-mixed form, the compositions of the at least one blocking layer 14 are mixed in the same crucible for evaporating. The advantage of the pre-mixed evaporation is that the number of crucibles may be reduced.

A relation between the first preset value and the second preset value is relative. Under a premise that the first preset value is lower than the second preset value, a difference between the first preset value and the second preset value may be set according to the performance of the at least two blocking materials and the actual requirements of the OLED, which is not limited in the embodiment of the present disclosure.

According to the embodiment of the present disclosure, at least two blocking materials are included in a same blocking layer 14, the electron mobility of at least one blocking material is lower than the first preset value, and the electron mobility of at least another blocking material is higher than the second preset value. The transport efficiency of the multiple carriers may be controlled, so that the number of the carriers transported to the light emitting layer and efficiently recombined is greater. Therefore, excess carriers of the carriers not recombined do not exist, and the destruction effect of the carriers not recombined on the film layers in the OLED 10 and the interface between the two adjacent film layers of the film layers may be reduced. Thus, the lifetime of the OLED 10 can be significantly improved while the higher light emitting efficiency of the OLED 10 is guaranteed.

Exemplarily, FIG. 1 shows an OLED 10 including one blocking layer 14, which is arranged between the light emitting layer 13 and the first electrode 11. The blocking layer 14 includes three blocking materials: a first blocking material 14$b$1, a second blocking material 14$b$2, and a third blocking material 14$b$3. Exemplarily, electron mobility of the first blocking material 14$b$1 is lower than the first preset value, electron mobility of the second blocking material 14$b$2 is greater than the second preset value, and electron mobility of the third blocking material 14$b$3 may be between the first preset value and the second preset value.

Exemplarily, FIG. 2 shows an OLED 10 including one blocking layer 14, which is arranged between the light emitting layer 13 and the first electrode 11. The blocking layer 14 includes two blocking materials: the first blocking material 14$b$1 and the second blocking material 14$b$2. Exemplarily, the electron mobility of the first blocking material 14$b$1 is lower than the first preset value, and the electron mobility of the second blocking material 14$b$2 is greater than the second preset value.

Exemplarily, FIG. 3 shows an OLED 10 including two blocking layers 14, which are respectively shown as a first blocking layer 141 and a second blocking layer 142. The first blocking layer 141 is arranged between the light emitting layer 13 and the second electrode 12, and the second blocking layer 142 is arranged between the light emitting layer 13 and the first electrode 11. The first blocking layer 141 includes two sub-blocking materials: a first sub-blocking material 141$b$1 and a second sub-blocking material 141$b$2. The second blocking layer 142 includes two sub-blocking materials: a third sub-blocking material 142$b$1 and a fourth sub-blocking material 142$b$2. Exemplarily, electron mobility of the first sub-blocking material 141$b$1 and electron mobility of the third sub-blocking material 142$b$1 are lower than the first preset value, and electron mobility of the second sub-blocking material 141$b$2 and electron mobility of the fourth sub-blocking material 142$b$2 are greater than the second preset value.

Thus, in the structures of the OLEDs 10 shown in FIG. 1 to FIG. 3, the number of the carriers injected into the light emitting layer 13 may be controlled by setting electron mobility of at least two blocking materials in the same blocking layer 14. Therefore, the number of the electrons and the holes in the light emitting layer 13 may be balanced, the electrons and the holes are effectively recombined, the destruction effect of the electrons not recombined on the film layers and the interface between the two adjacent film layers of the film layers is reduced, and the lifetime of the OLED 10 is improved while the higher light emitting efficiency of the OLED 10 is guaranteed.

FIG. 1 to FIG. 3 only exemplarily show three structures of the OLED, but do not limit the OLED provided by the embodiment of the present disclosure. In other implementations, according to the actual requirements of the OLED 10, the blocking layer 14 may be arranged only between the light emitting layer 13 and the second electrode 12, and more blocking materials may further be arranged in the blocking layer 14, which is not limited in the embodiment of the present disclosure.

Continuing to refer to FIG. 2 or FIG. 3, the same blocking layer 14 (the first blocking layer 141 or the second blocking layer 142 in FIG. 3) includes the first blocking material 14b1 (the first sub-blocking material 141b1 or the third sub-blocking material 142b1 in FIG. 3) and the second blocking material 14b2 (the second sub-blocking material 141b2 or the fourth sub-blocking material 142b2 in FIG. 3). The electron mobility of the first blocking material 14b1 is lower than the electron mobility of the second blocking material 14b2. A sum of a volume of the first blocking material 14b1 and a volume of the second blocking material 14b2 is represented as S, the volume of the first blocking material 14b1 is represented as X, and 10%≤X/S≤70%.

The greater the proportion of the volume of the first blocking material 14b1 in the total volume of the first blocking material 14b1 and the second blocking material 14b2, the lower the total electron mobility of the blocking layer 14 and the longer the lifetime of the OLED 10. The less the proportion of the volume of the first blocking material 14b1 in the total volume of the first blocking material 14b1 and the second blocking material 14b2, the higher the total electron mobility of the blocking layer 14 and the higher the light emitting efficiency of the OLED 10. According to the above ratio range, it is guaranteed that the OLED 10 has higher light emitting efficiency and longer lifetime.

In addition, the blocking layer 14 includes two blocking materials, and the light emitting efficiency and the lifetime of the OLED 10 may be controlled through setting the ratio of these two blocking materials. Therefore, it is less difficult to design the OLED 10.

The embodiment of the present disclosure only exemplarily shows the sum of the volume of the first barrier material 14b1 and the volume of the second barrier material 14b2 as S, the volume of the first blocking material 14b1 is represented as X, and 10%≤X/S≤70%. This is not a limitation of the OLED 10 provided by the embodiment of the present disclosure. In other implementations, according to the actual requirements of the OLED 10, the proportion of the volume of the first blocking material 14b1 in the total volume of the first blocking material 14b1 and the second blocking material 14b2 may be set, such as 30%≤X/S≤60% or 20%≤X/S≤50%. This is not limited in the embodiment of the present disclosure.

In addition, FIG. 2 only exemplarily shows that the first blocking material 14b1 and the second blocking material 14b2 are mixed to form one blocking layer 14, which is not intended to limit the OLED 10 provided by the embodiment of the present disclosure. In other implementations, according to the actual requirements of the OLED 10, the first blocking material 14b1 may form a first sub-blocking layer, the second blocking material 14b2 may form a second sub-blocking layer, and the first sub-blocking layer and the second sub-blocking layer together form the blocking layer 14. In addition, in order to balance the number of the electrons and the number of the holes in the light emitting layer 13, the second sub-blocking layer may be arranged on a side of the first sub-blocking layer close to the light emitting layer 13, or the second sub-blocking layer may be arranged on a side of the first sub-blocking layer away from the light emitting layer 13, which is not limited in the embodiment of the present disclosure.

In an embodiment, continuing to refer to FIG. 3, at least one blocking layer 14 includes a hole blocking layer 141 (that is, the above first blocking layer 141). The hole blocking layer 141 is arranged between the light emitting layer 13 and the second electrode 12. The hole blocking layer 141 includes a first hole blocking material 141b1 (that is, the above first sub-blocking material 141b1) and a second hole blocking material 141b2 (that is, the above second sub-blocking material 141b2). Electron mobility of the first hole blocking material 141b1 is lower than electron mobility of the second hole blocking material 141b2. In the hole blocking layer, a sum of a volume of the first hole blocking material 141b1 and a volume of the second hole blocking material 141b2 is represented as S1, the volume of the first hole blocking material 141b1 is represented as X1, and 10%≤X1/S1≤60%.

As such, the number of electrons injected into the light emitting layer 13 may be controlled, and an effect of blocking holes is achieved, so that the number of the electrons and the number of the holes in the light emitting layer 13 are balanced, the electrons and the holes may be effectively recombined, and the light emitting efficiency of the OLED 10 is improved. At the same time, the number of electrons not recombined is less, so that the lifetime of the OLED can be significantly improved.

In other implementations, according to the actual requirements of the OLED, the proportion of the first hole blocking material 141b1 in the sum of the volume of the first hole blocking material 141b1 and the volume of the second hole blocking material 141b2 may be set, such as 30%≤X1/S1≤60%, or 20%≤X1/S1≤50%, which is not limited in the embodiment of the present disclosure.

In an embodiment, a volume ratio of the first hole blocking material 141b1 to the second hole blocking material 141b2 is 1:1.

The larger the volume of the first hole blocking material 141b1, the lower the total electron mobility of the hole blocking layer 141. Therefore, the number of the electrons injected into the light emitting layer 13 is less, and the lifetime of the OLED is longer. The larger the volume of the second hole blocking material 141b2, the higher the total electron mobility of the hole blocking layer 141. Therefore, the number of the electrons injected into the light emitting layer 13 is greater, and the light emitting efficiency of the OLED 10 is higher.

The volume ratio of the first hole blocking material 141b1 to the second hole blocking material 141b2 is 1:1, so that overall performance of the hole blocking layer 141 is better, and the lifetime of the OLED 10 can be improved while the higher light emitting efficiency of the OLED 10 is guaranteed.

In an embodiment, the electron mobility B1 of the first hole blocking material 141b1 satisfies $1.0\times10^{-6}$ cm$^2$/(V·s) ≤B1≤$1.0\times10^{-5}$ cm$^2$/(V·s); the electron mobility C1 of the second hole blocking material 141b2 satisfies $1.0\times10^{-5}$ cm$^2$/(V·s)≤C1≤$1.0\times10^{-4}$ cm$^2$/(V·s).

As such, the hole blocking layer 141 may include two hole blocking materials with different electron mobility, so that the control of the number of the electrons injected into the light emitting layer 13 may be implemented, and the lifetime of the OLED 10 can be improved while the higher light emitting efficiency of the OLED 10 is guaranteed.

The specific values of the electron mobility of the first hole blocking material 141b1 and the electron mobility of the second hole blocking material 141b2 may be set according to the actual requirements of the OLED, which is not limited in the embodiment of the present disclosure.

Exemplarily, referring to Table 1, the embodiment of the present disclosure exemplarily shows a comparison table of light emitting characteristics of a set of the OLEDs provided by the related arts and the OLED provided by the present disclosure.

TABLE 1

Comparison table of the light emitting characteristics of the OLEDs provided by the related arts and the OLED provided by the present disclosure

| Device | Op. V (V) | Eff. 1 (cd/A) | Eff. 2 (lm/W) | CIE (x, y) | Peak (nm) | LT97 (h) |
|---|---|---|---|---|---|---|
| D1 | 4.54 | 5.63 | 3.89 | (0.1370, 0.0636) | 460 | 290 |
| D2 | 4.15 | 7.18 | 5.44 | (0.1378, 0.0647) | 460 | 140 |
| D3 | 4.29 | 7.08 | 5.18 | (0.1372, 0.0648) | 460 | 250 |

Device 1 represents an OLED provided by the related arts, device D2 represents another OLED provided by the related arts, and device D3 represents the OLED provided by the present disclosure. The same among the device D1, the device D2 and the device D3 includes the followings: the ITO is employed as the material of the first electrode and the thickness of the first electrode is 10 nm; the thickness of a hole injection layer is 10 nm; the thickness of a hole transport layer is 120 nm; the thickness of an electron blocking layer is 5 nm; the thickness of a light emitting layer is 20 nm; the thickness of a hole blocking layer is 5 nm; the thickness of an electron transport layer is 30 nm; the thickness of an electron injection layer is 1 nm; a metal electrode is employed as the material of the second electrode, and the thickness of the second electrode is 13-20 nm. The difference among the device D1, the device D2 and the device D3 includes the followings: electron mobility of the hole blocking layer of the device D1 is $5.2 \times 10^{-6}$ cm$^2$/(V·s); electron mobility of the hole blocking layer of the device D2 is $4.5 \times 10^{-5}$ cm$^2$/(V·s); a material of the hole blocking layer of the device D3 is a mixture of two hole blocking materials in the device D1 and the device D2, and a volume ratio of these two hole blocking materials is 1:1. On the basis of the above film layer structures of the device D1, the device D2 and the device D3, the light emitting characteristics of the these three devices are tested, and it is required that the luminance of these three devices is 1200 candelas per square meter (cd/m$^2$), and the test results shown in Table 1 are obtained.

Op.V represents operating voltage in volt (V), Eff.1 represents current efficiency in candelas per ampere (cd/A), Eff.2 represents luminous efficiency, also called photometric efficiency, in lumens per watt (lm/W), CIE (x, y) represents color coordinates; Peak represents a peak position of an emission spectrum of the OLED 10 in nanometer (nm), LT97 represents the lifetime of the OLED 10 in hour (h), that is, when a constant current test is performed at 1200 cd/m$^2$, a light emitting duration corresponding to an obtained luminance of a device reducing to 97% of the initial luminance is a lifetime of the device.

According to comparison data of the light emitting characteristics of the OLED in Table 1, the light emitting efficiency of the device D1 is lower, and the lifetime of the device D2 is shorter. According to the embodiment of the present disclosure, the hole blocking layer includes two hole blocking materials with different electron mobility, so that the light emitting efficiency of the device D3 is higher (relative to the device D1) and the lifetime of the device D3 is improved (relative to the device D2). That is, the effect of simultaneously improving the light emitting efficiency (mainly, current efficiency) and the lifetime of the OLED 10 is achieved.

The above comparison among the device D1, the device D2 and the device D3 is only an exemplary illustration of the OLED 10 provided by the embodiment of the present disclosure, and is not a limitation.

In an embodiment, continuing to refer to FIG. 3, at least one blocking layer 14 includes an electron blocking layer 142 (that is, the above second blocking layer 142). The electron blocking layer 142 is arranged between the light emitting layer 13 and the first electrode 11. The electron blocking layer 142 includes a first electron blocking material 142b1 (that is, the above third sub-blocking material 142b1) and a second electron blocking material 142b2 (that is, the above fourth sub-blocking material 142b2). Electron mobility of the first electron blocking material 142b1 is lower than electron mobility of the second electron blocking material 142b2. In the electron blocking layer, a sum of a volume of the first electron blocking material 142b1 and a volume of the second electron blocking material 142b2 is represented as S2, a volume of the first electron blocking material 142b1 is represented as X2, and 20%≤X2/S2≤70%.

As such, the number of the holes injected into the light emitting layer 13 may be controlled and the effect of blocking electrons is achieved, so that the number of the electrons and the number of the holes in the light emitting layer 13 are balanced, the electrons and the hole are efficiently recombined, and the light emitting efficiency of the OLED 10 is improved. At the same time, since the number of the holes (which are still "electrons" in nature, but the "electrons" are located in different molecular orbitals from the electrons in the above) not recombined is less, the destruction effect of the holes on the film layers is less, and the lifetime of the OLED 10 can be significantly improved.

In other implementations, according to the actual requirements of the OLED 10, the proportion of the volume of the first electron blocking material 142b1 in the sum of the volume of the first electron blocking material 142b1 and the volume of the second electron blocking material 142b2 may be set, such as 30%≤X2/S2≤60%, or 20%≤X2/S2≤50%, which is not limited in the embodiment of the present disclosure.

In an embodiment, a volume ratio of the first electron blocking material 142b1 to the second electron blocking material 142b2 is 1:1.

The larger the volume of the first electron blocking material 142b1, the lower the total electron mobility of the electron blocking layer 142. Since a tendency of a change of hole mobility and a tendency of a change of the electron mobility are the same, when the total electron mobility of the electron blocking layer 142 is lower, the hole mobility of the electron blocking layer 142 is lower. At this time, the number of holes injected into the light emitting layer 13 is less, and the lifetime of the OLED 10 is longer. Similarly, the larger the volume of the second electron blocking material 142b2, the higher the total hole mobility of the electron blocking layer 142.

The number of the holes injected into the light emitting layer 13 is greater, so that the light emitting efficiency of the OLED 10 is higher.

As such, the overall performance of the electron blocking layer 142 is better, and the lifetime of the OLED is improved while the higher light emitting efficiency of the OLED is guaranteed.

In an embodiment, the electron mobility B2 of the first electron blocking material 142b1 satisfies $1.0 \times 10^{-7}$ cm$^2$/(V·s)≤B2≤$1.0 \times 10^{-5}$ cm$^2$/(V·s); the electron mobility C2 of the second electron blocking material 142b2 satisfies $1.0 \times 10^{-5}$ cm$^2$/(V·s)≤C2≤$1.0 \times 10^{-4}$ cm$^2$/(V·s).

As such, the electron blocking layer 142 may include two electron blocking materials with different electron mobility, so that the control of the number of the holes injected into the light emitting layer 13 is implemented, the balance of the number of the electrons and the number of the holes injected into the light emitting layer 13 is implemented, and the lifetime of the OLED 10 is improved while the higher light emitting efficiency of the OLED 10 is guaranteed.

The specific values of the electron mobility of the first electron blocking material 142b1 and the electron mobility of the second electron blocking material 142b2 may be set according to the actual requirements of the OLED 10, which is not limited in the embodiment of the present disclosure.

In addition, FIG. 3 only exemplarily shows that, when at least one blocking layer 14 includes the hole blocking layer 141 and the electron blocking layer 142, the hole blocking layer 141 includes the first hole blocking material 141b1 and the second hole blocking material 141b2, and the electron blocking layer 142 includes the first electron blocking material 142b1 and the second electron blocking material 142b2, which is not intended to limit the OLED 10 provided by the embodiment of the present disclosure. In other implementations, according to the actual requirements of the OLED 10, the hole blocking layer 141 may include two or more hole blocking materials, and the electron blocking layer 142 may include one electron blocking material. In an embodiment, the hole blocking layer 141 may include one hole blocking material, and the electron blocking layer 142 may include two or more electron blocking materials. This is not limited in the embodiment of the present disclosure.

Figure 4:
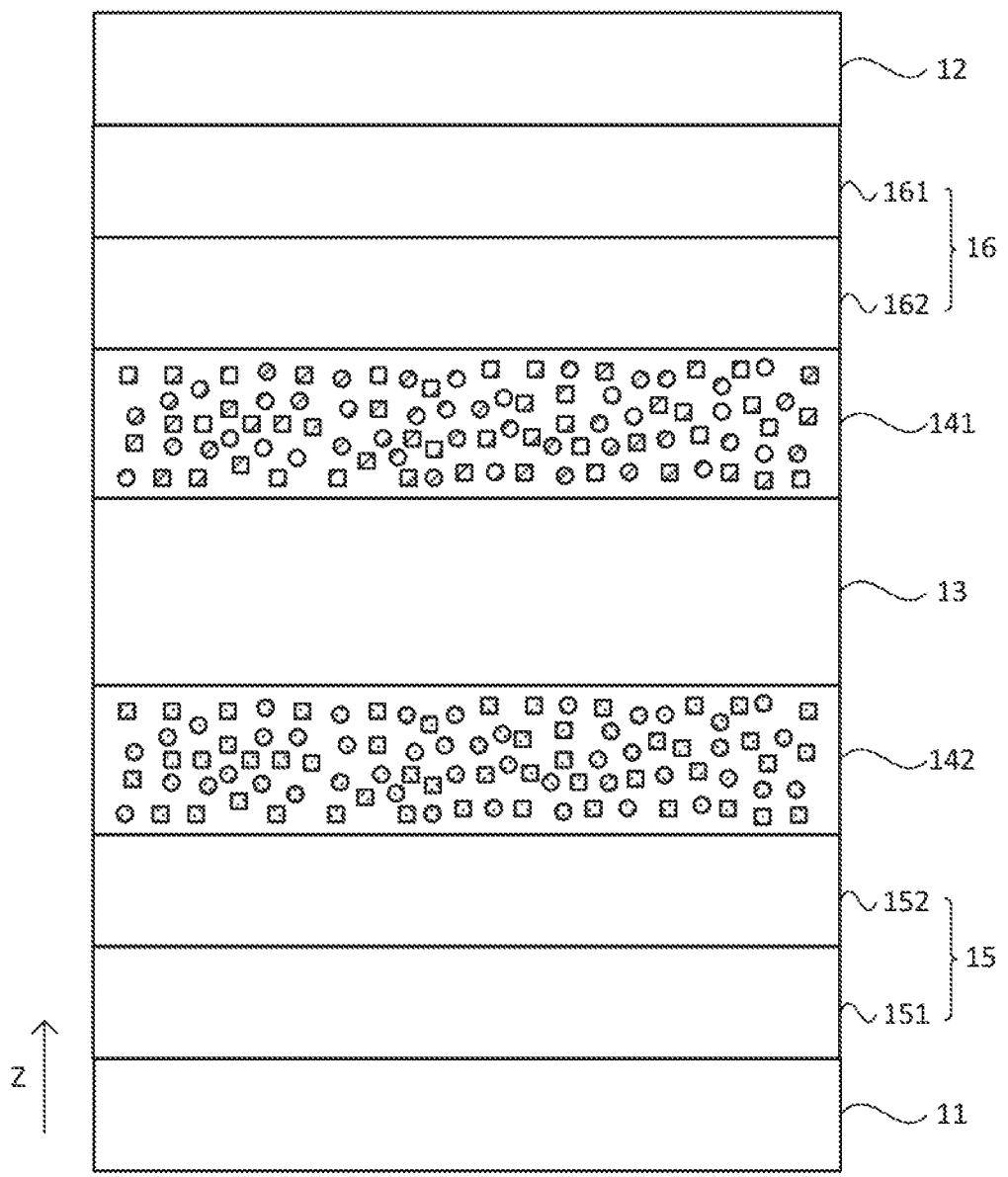
FIG. 4 is a structural diagram of another OLED provided by an embodiment of the present disclosure, in which the OLED 10 may further include a first carrier function layer 15 and a second carrier function layer 16.

In an embodiment, FIG. 4 is a structural diagram of another OLED provided by the embodiment of the present disclosure. Referring to FIG. 4, the OLED 10 may further include a first carrier function layer 15 and a second carrier function layer 16. The first carrier function layer 15 is arranged between the light emitting layer 13 and the first electrode 11. When the electron blocking layer 142 is arranged between the light emitting layer 13 and the first electrode 11, the first carrier function layer 15 is arranged between the electron blocking layer 142 and the first electrode 11. The second carrier function layer 16 is arranged between the light emitting layer 13 and the second electrode 12. When the hole blocking layer 141 is arranged between the light emitting layer 13 and the second electrode 12, the second carrier function layer 16 is arranged between the hole blocking layer 141 and the second electrode 12.

The first carrier function layer 15 is used for transporting and injecting the holes into the light emitting layer 13. The first carrier function layer 15 may include a hole injection layer 151 and a hole transport layer 152. The second carrier function layer 16 is used for transporting and injecting the electrons into the light emitting layer 13. The second carrier function layer 16 may include an electron injection layer 161 and an electron transport layer 162.

Both the above first carrier function layer 15 and the second carrier function layer 16 may be made of materials known by those skilled in the art, which is not repeated and limited herein.

Figure 5:
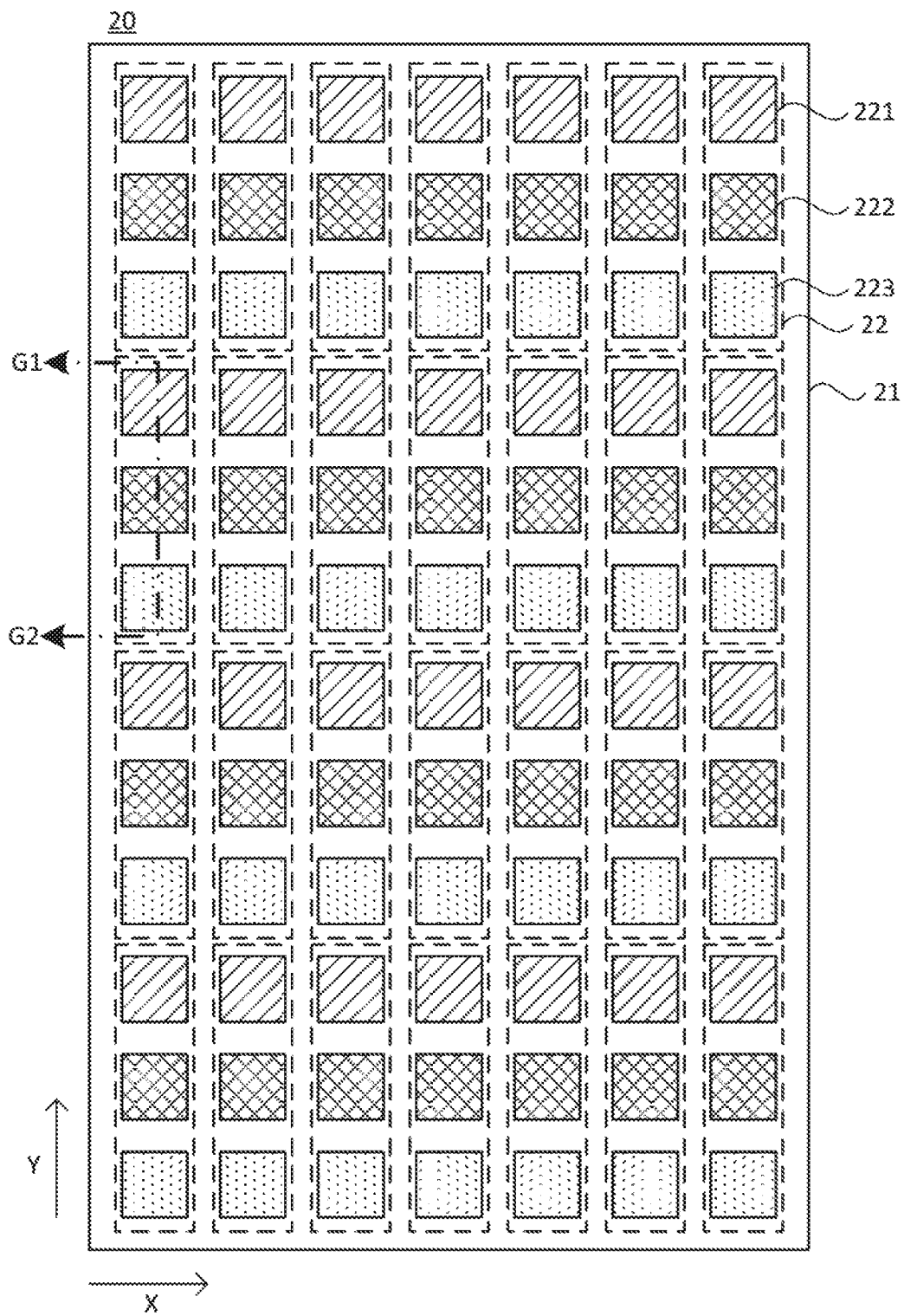
FIG. 5 is a structural diagram of a display panel provided by an embodiment of the present disclosure.

On the basis of the above implementations, the embodiment of the present disclosure further provides a display panel. Exemplarily, FIG. 5 is a structural diagram of the display panel provided by the embodiment of the present disclosure. Referring to FIG. 5, the display panel 20 includes a substrate 21 and a plurality of pixel units 22 arranged in an array on a side of the substrate 21. At least a part of the pixel units 22 includes any one of the OLEDs provided by the above implementations (that is, the pixel units 22 include sub-pixels, and at least a part of the sub-pixels may include any one of the OLED structures provided by the above implementations). Thus, the display panel 20 also has the advantages of the above OLED, which may be understood by referring to the above description, and will not be repeated herein.

The substrate 21 may be an array substrate for driving the pixel units 22 to emit light.

Exemplarily, FIG. 5 shows a row direction X and a column direction Y (a plane where the row direction X and the column direction Y are located shown in FIG. 5 is a plane where the substrate 21 is located), and shows the pixel units 22 arranged in 7 columns and 4 rows. Each pixel unit 22 may include a blue sub-pixel 221, a red sub-pixel 222 and a green sub-pixel 223.

At the same time, these three sub-pixels in each pixel unit 22 are arranged in the order of the blue sub-pixel 221, the red sub-pixel 222, and the green sub-pixel 223 along the column direction Y. These are only exemplary illustrations of the display panel 20 provided by the embodiment of the present disclosure, and are not a limitation. In other implementations, an array arrangement of the pixel units 22, and the number and an arrangement of the blue sub-pixel 221, the red sub-pixel 222 and the green sub-pixel 223 in each pixel unit 22 may be set according to the actual requirements of the display panel 20, which is not limited in the embodiment of the present disclosure.

Any one of the OLED structures provided by the above implementations may be employed to at least one sub-pixel in each pixel unit 22. Exemplarily, any one of the OLED structures provided by the above implementations may be employed to the blue sub-pixel 221. Alternatively, any one of the OLED structures provided by the above implementations may be employed to all the blue sub-pixel 221, the red sub-pixel 222 and the green sub-pixel 223. This may be set according to the actual requirements of the display panel 20, and is not limited in the embodiment of the present disclosure.

Figure 6:
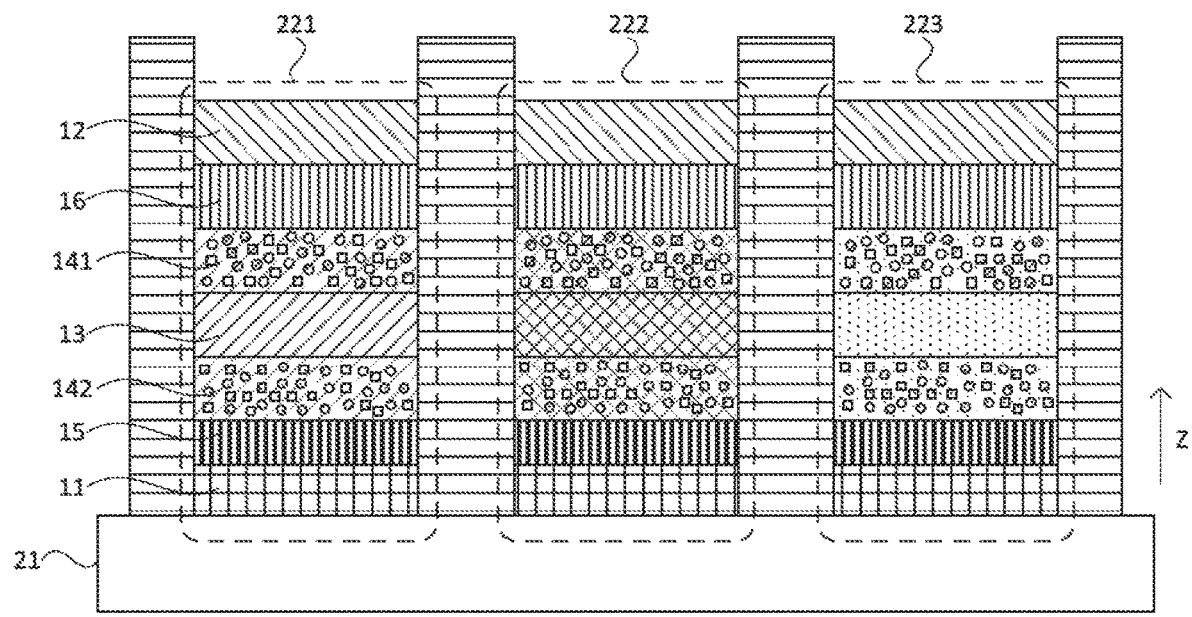
FIG. 6 is a structural diagram of a cross-section of the display panel along a G1-G2 direction.

Exemplarily, FIG. 6 is a structural diagram of a cross-section of the display panel 20 along a G1-G2 direction. Combining FIG. 5 and FIG. 6, each of these three sub-pixels (including the blue sub-pixel 221, the red sub-pixel 222 and the green sub-pixel 223) in each pixel unit 22 includes the first electrode 11, the first carrier function layer 15, the electron blocking layer 142, the light emitting layer 13, the hole blocking layer 141, the second carrier function layer 16 and the second electrode 12 stacked in a vertical direction Z (where the vertical direction Z is a direction perpendicular to the plane where the row direction X and the column direction Y are located). The electron blocking material of the electron blocking layer 142 included in each of the blue sub-pixel 221, the red sub-pixel 222 and the green sub-pixel 223, and the hole blocking material of the hole blocking layer 141 included in each of the blue sub-pixel 221, the red sub-pixel 222 and the green sub-pixel 223 may be set according to the actual requirements of each of the blue sub-pixel 221, the red sub-pixel 222 and the green sub-pixel 223, and is not limited in the embodiment of the present disclosure.

In addition, a specific type of the display panel 20 is not limited in the embodiment of the present disclosure. The present disclosure may be applied to any display panel related to the transport of the electrons and the holes. Exemplarily, the display panel may be an OLED display panel, a Quantum Dot Light Emitting Diodes (QLED) display panel, or other display panels known by those skilled in the art.

Figure 7:
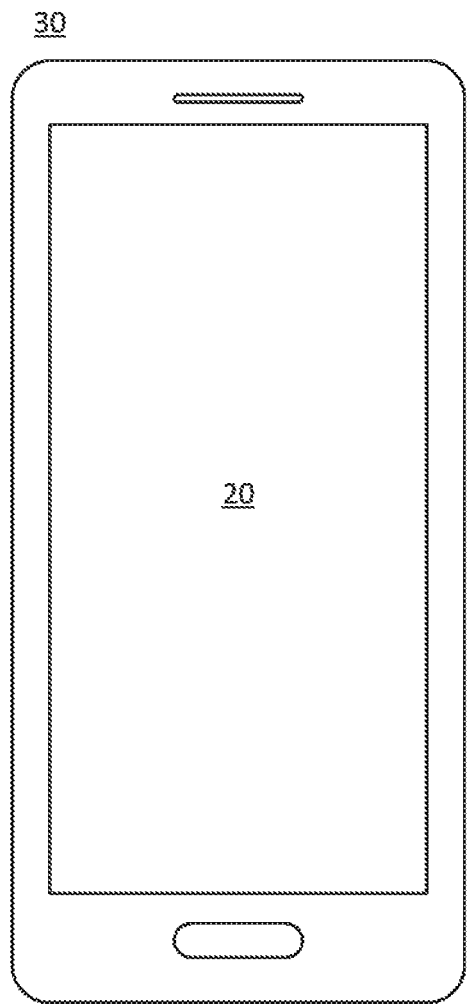
FIG. 7 is a structural diagram of a display device provided by an embodiment of the present disclosure.

The embodiment of the present disclosure further provides a display device. Exemplarily, FIG. 7 is a structural diagram of the display device provided by the embodiment of the present disclosure. Referring to FIG. 7, the display device 30 includes the display panel 20 provided by the above implementations. Therefore, the display device 30 also has the advantages of the above display panel 20, which may be understood by referring to the above description, and will not be repeated herein.

Exemplarily, the display device 30 may be a cell phone, tablet personal computer, or other electronic display equipment known by those skilled in the art, which is not limited in the embodiment of the present disclosure.

The above is only a preferred embodiment of the present disclosure and a technical principle applied in the present disclosure. For those skilled in the art, various obvious changes, readjustments and substitutions may be conducted without departing from the protection scope of the present disclosure. The scope of the present disclosure is determined by the scope of accompanying claims.

What is claimed is:

1. An organic light emitting diode (OLED), comprising:
a first electrode;
a second electrode arranged oppositely to the first electrode;
a light emitting layer arranged between the first electrode and the second electrode; and
at least one blocking layer arranged between the light emitting layer and the second electrode, or arranged between the light emitting layer and the first electrode;
wherein each blocking layer of the at least one blocking layer comprises at least two blocking materials, electron mobility of at least one blocking material of the at least two blocking materials is lower than a first preset value, electron mobility of at least another blocking material of the at least two blocking materials is higher than a second preset value, and the first preset value is lower than the second preset value;
wherein the at least one blocking layer comprises a hole blocking layer, the hole blocking layer is arranged between the light emitting layer and the second electrode;
the hole blocking layer comprises a first hole blocking material and a second hole blocking material, electron mobility of the first hole blocking material is lower than electron mobility of the second hole blocking material;
wherein the electron mobility of the first hole blocking material is represented as B1, and $1.0\times10^{-6} cm^2/(V \cdot s) \leq B1 \leq 1.0\times10^{-5} cm^2/(V \cdot s)$;
the electron mobility of the second hole blocking material is represented as C1, and $1.0\times10^{-5} cm^2/(V \cdot s) \leq C1 \leq 1.0\times10^{-4} cm^2/(V \cdot s)$.

2. The OLED of claim 1, wherein the each blocking layer comprises a first blocking material and a second blocking material, wherein electron mobility of the first blocking material is lower than electron mobility of the second blocking material;
in the each blocking layer, a sum of a volume of the first blocking material and a volume of the second blocking material is represented as S, the volume of the first blocking material is represented as X, and $10\% \leq X/S \leq 70\%$.

3. The OLED of claim 2, Wherein, in the each blocking layer, the volume of the first blocking material and the volume of the second blocking material satisfy a following relation: $20\% \leq X/S \leq 50\%$.

4. The OLED of claim 1, wherein
in the hole blocking layer, a sum of a volume of the first hole blocking material and a volume of the second hole blocking material is represented as S1, the volume of the first hole blocking material is represented as X1, and $10\% \leq X1/S1 \leq 60\%$.

5. The OLED of claim 1, wherein, in the hole blocking layer, a ratio of the volume of the first hole blocking material to the sum of the volume of the first hold blocking material and the volume of the second hole blocking material satisfies: $20\% \leq X1/S1 \leq 50\%$.

6. The OLED of claim 1, wherein a volume ratio of the first hole blocking material to the second hole blocking material is 1:1.

7. The OLED of claim 1, wherein the at least one blocking layer comprises an electron blocking layer, the electron blocking layer is arranged between the light emitting layer and the first electrode;
the electron blocking layer comprises a first electron blocking material and a second electron blocking material, electron mobility of the first electron blocking material is lower than electron mobility of the second electron blocking material;
in the electron blocking layer, a sum of a volume of the first electron blocking material and a volume of the second electron blocking material is represented as S2, a volume of the first electron blocking material is represented as X2, and $20\% \leq X2/S2 \leq 70\%$.

8. The OLED of claim 7, wherein, in the electron blocking layer, a ratio of the volume of the first electron blocking material to the sum of the volume of the first electron blocking material and the volume of the second electron blocking material satisfies: $30\% \leq X2/S2 \leq 60\%$.

9. The OLED of claim 7, wherein a volume ratio of the first electron blocking material to the second electron blocking material is 1:1.

10. The OLED of claim 7, wherein the electron mobility of the first electron blocking material is represented as B2, and $1.0\times10^{-7} cm^2/(V \cdot s) \leq B2 \leq 1.0\times10^{-5} cm^2/(V \cdot s)$;
the electron mobility of the second electron blocking material is represented as C2, and $1.0\times10^{-5} cm^2/(V \cdot s) \leq C2 \leq 1.0\times10^{-4} cm^2/(V \cdot s)$.

11. The OLED of claim 1, further comprising a first carrier function layer and a second carrier function layer;
wherein the first carrier function layer is arranged between the light emitting layer and the first electrode, and in a case where the at least one blocking layer is arranged between the light emitting layer and the first electrode, the first carrier function layer is arranged between the at least one blocking layer and the first electrode;
the second carrier function layer is arranged between the light emitting layer and the second electrode, and in a case where the at least one blocking layer is arranged between the light emitting layer and the second electrode, the second carrier function layer is arranged between the at least one blocking layer and the second electrode.

12. The OLED of claim 11, wherein the first carrier function layer comprises a hole injection layer and a hole transport layer stacked along a direction from the first electrode towards the light emitting layer;

the second carrier function layer comprises an electron injection layer and an electron transport layer stacked along a direction from the second electrode towards the light emitting layer.

13. A display panel, comprising a substrate and a plurality of pixel units arranged in an array on a side of the substrate;

wherein at least a part of the plurality of pixel units comprises an organic light emitting diode (OLED) of claim 1.

14. A display device, comprising the display panel of claim 13.

15. The OLED of claim 1, wherein the electron mobility of the first hole blocking material is $5.2 \times 10^{-6} cm^2/(V \cdot s)$, and the electron mobility of the second hole blocking material is $4.5 \times 10^{-5} cm^2/(V \cdot s)$.

16. The OLED of claim 1, wherein in the hole blocking layer, a sum of a volume of the first hole blocking material and a volume of the second hole blocking material is represented as S1, the volume of the first hole blocking material is represented as X1, and $10\% \leq X1/S1 \leq 50\%$.

17. The OLED of claim 1, wherein a volume ratio of the first hole blocking material to the second hole blocking material is 1:1, the electron mobility of the first hole blocking material is $5.2 \times 10^{-6} cm^2/(V \cdot s)$, and the electron mobility of the second hole blocking material is $4.5 \times 10^{-5} cm^2/(V \cdot s)$.

* * * * *